(12) United States Patent
Zhang et al.

(10) Patent No.: US 12,514,046 B2
(45) Date of Patent: Dec. 30, 2025

(54) LIGHT EMITTING DEVICE AND LIGHTING APPARATUS USING THE SAME

(71) Applicant: TIANJIN SANAN OPTOELECTRONICS CO., LTD., Tianjin (CN)

(72) Inventors: Si Zhang, Tianjin (CN); Shuili Yu, Tianjin (CN); Chenming Wu, Tianjin (CN); Kunte Lin, Tianjin (CN); Huan-Shao Kuo, Tianjin (CN); Jiansheng Qiu, Fujian (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 393 days.

(21) Appl. No.: 18/173,455

(22) Filed: Feb. 23, 2023

(65) Prior Publication Data
US 2023/0207767 A1 Jun. 29, 2023

Related U.S. Application Data

(63) Continuation-in-part of application No. PCT/CN2020/137647, filed on Dec. 18, 2020.

(51) Int. Cl.
*H10H 20/857* (2025.01)
*H10H 20/824* (2025.01)

(52) U.S. Cl.
CPC ........ *H10H 20/857* (2025.01); *H10H 20/824* (2025.01)

(58) Field of Classification Search
CPC .................. H10H 20/857; H10H 20/824
See application file for complete search history.

(56) References Cited

U.S. PATENT DOCUMENTS 10,714,659 B2 * 7/2020 Park ................... H10H 20/8316
11,728,371 B2 * 8/2023 Yeon ................... H10H 20/8312
257/89

(Continued)

FOREIGN PATENT DOCUMENTS

CN 205016552 U 2/2016

OTHER PUBLICATIONS

Search Report issued to PCT application No. PCT/CN2020/137647 on Sep. 24, 2021.

*Primary Examiner* — Eugene Lee
(74) *Attorney, Agent, or Firm* — MUNCY, GEISSLER, OLDS & LOWE, P.C.

(57) ABSTRACT

A light-emitting device includes a semiconductor structure, a through hole, an electrical connecting structure, and a first electrode metal layer. The semiconductor structure has a first surface and a second surface, and includes a first-type semiconductor layer, a second-type semiconductor layer, and an active layer. The first surface is located on the first-type semiconductor layer, and the second surface is located on the second-type semiconductor layer. The through hole passes through the first-type semiconductor layer, the second-type semiconductor layer, and the active layer. The through hole has a first section, and the first-type semiconductor layer is exposed through the first section to electrically connect with the electrical connecting structure. A first angle between a side wall of the first type semiconductor layer that bounds the first section and the plane of the first surface ranges from 0° to 90°.

20 Claims, 5 Drawing Sheets

(56) References Cited

U.S. PATENT DOCUMENTS

| | | | |
|---|---|---|---|
| 2008/0315241 A1* | 12/2008 | Shum | H10H 20/8506 |
| | | | 438/26 |
| 2010/0203660 A1* | 8/2010 | Tanaka | H01S 5/18305 |
| | | | 257/E33.069 |
| 2015/0243846 A1* | 8/2015 | Kwon | H10H 20/857 |
| | | | 257/99 |
| 2017/0047484 A1* | 2/2017 | Kuo | H10H 20/833 |
| 2017/0077353 A1 | 3/2017 | Kim et al. | |
| 2018/0047876 A1* | 2/2018 | Chu | H01L 25/0753 |
| 2018/0301597 A1* | 10/2018 | Park | H10H 20/816 |
| 2019/0189865 A1* | 6/2019 | Shimizu | G09G 3/32 |

\* cited by examiner

LIGHT EMITTING DEVICE AND LIGHTING APPARATUS USING THE SAME

CROSS-REFERENCE TO RELATED APPLICATION

This application is a continuation-in-part (CIP) of International Application No. PCT/CN2020/137647, filed on Dec. 18, 2020.

FIELD

The disclosure relates to a light-emitting device, and more particularly to a light-emitting device and a lighting apparatus using the same.

BACKGROUND

A light-emitting diode (LED) is a semiconductor diode that can convert electrical energy into light. In comparison to traditional electrical lighting, LEDs have the advantages of high luminous intensity, high efficiency, compact volume, and long service life, etc. LEDs are therefore considered to be a lighting technology with a lot of future potential. LEDs are widely employed in lighting, signal displays, backlight sources, vehicle lamps, and screen displays.

SUMMARY

Therefore, an object of the disclosure is to provide a light-emitting device.

According to a first aspect of the disclosure, the light-emitting device includes a semiconductor structure, a through hole, an electrical connecting structure, and a first electrode metal layer. The semiconductor structure has a first surface and a second surface that is opposite to the first surface, and includes a first-type semiconductor layer, a second-type semiconductor layer, and an active layer that is located between the first-type semiconductor layer and the second-type semiconductor layer. The first surface of the semiconductor structure is located on the first-type semiconductor layer, and the second surface of the semiconductor structure is located on the second-type semiconductor layer. The through hole passes through the first-type semiconductor layer, the second-type semiconductor layer, and the active layer of the semiconductor structure. The electrical connecting structure is disposed in the through hole, the electrical connecting structure extends from the through hole to the first surface of the semiconductor structure to be electrically connected to the first-type semiconductor layer. A first electrode metal layer is disposed on and electrically insulated from the second surface of the semiconductor structure, and is electrically connected to the electrical connecting structure. The through hole has a first section, and the first-type semiconductor layer is exposed through the first section of the through hole to be electrically connected with the electrical connecting structure within the through hole. A first angle between a side wall of the first-type semiconductor layer that bounds the first section of the through hole and the plane of the first surface ranges from 0° to 90°.

According to another aspect of the disclosure, the light-emitting device includes a semiconductor structure, a through hole, an electrical connecting structure, and a first electrode metal layer. The semiconductor structure has a first surface, and a second surface opposite to the first surface, and includes a first-type semiconductor layer, a second-type semiconductor layer, and an active layer that is located between the first-type semiconductor layer and the second-type semiconductor layer. The first surface of the semiconductor structure is located on the first-type semiconductor layer, and the second surface is located on the second-type semiconductor layer. The through hole passes through the first surface, the second surface, and the active layer of the semiconductor structure. The electrical connecting structure is disposed in the through hole, and contacts the first-type semiconductor layer. A first electrode metal layer is disposed on and electrically insulated from the second surface of the semiconductor structure, and is electrically connected to the electrical connecting structure. The through hole has a first section, and the first-type semiconductor layer is exposed through the first section of the through hole to be electrically connected with the electrical connecting structure within the through hole. A first angle between a side wall of the first type semiconductor layer that bounds the first section of the through hole and the plane of the first surface ranges from 0° to 90°.

The disclosure further discloses a lighting apparatus that uses the light-emitting device from the other aspects of the disclosure.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 1:
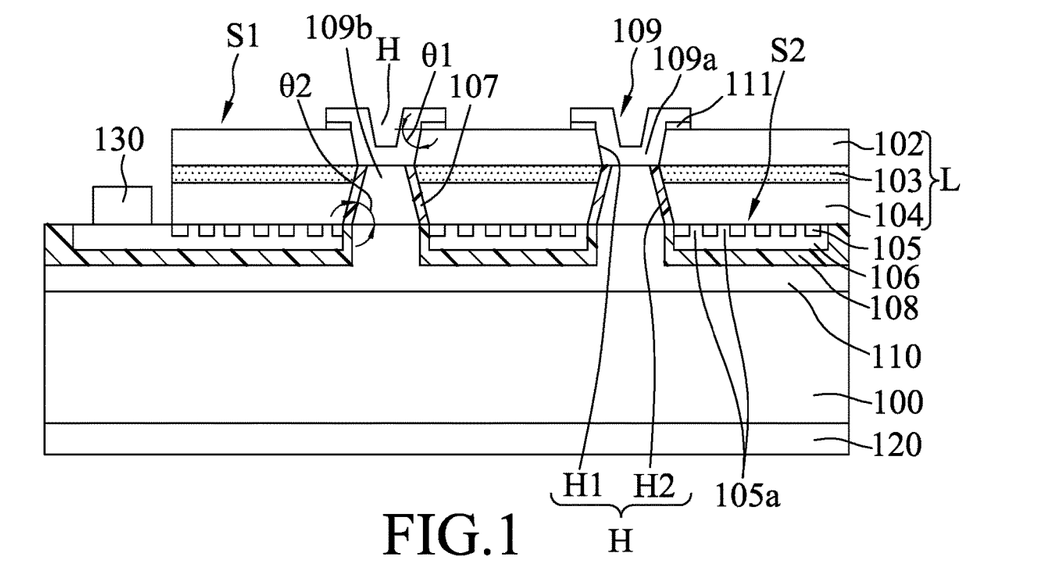
FIG. 1 is a schematic side view illustrating a first embodiment of a light-emitting device according to the present disclosure.
Figure 2:
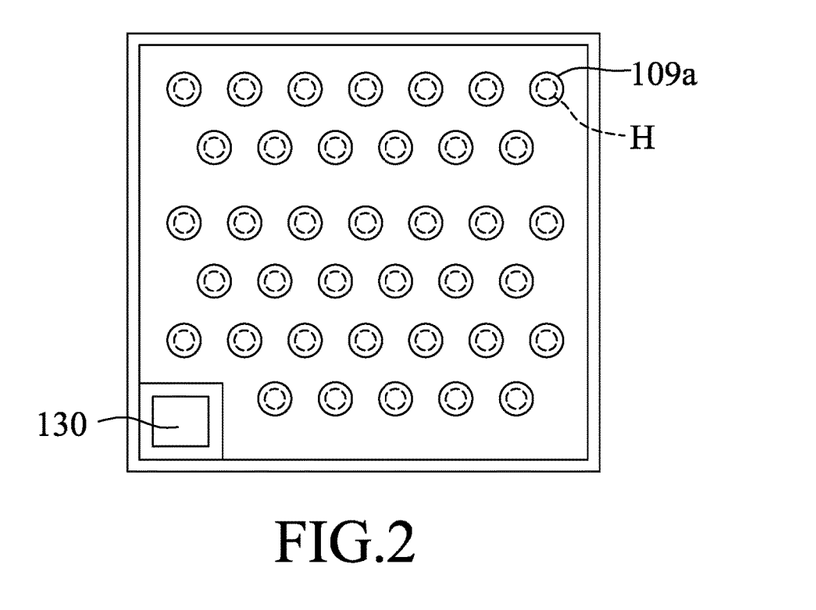
FIG. 2 is a schematic top view illustrating the first embodiment.

Referring to FIGS. 1 and 2, a first embodiment of the light-emitting device 10 according to the present disclosure is shown. The first embodiment includes the following components that are sequentially stacked from the bottom up: a substrate 100, a first electrode metal layer 110, a second insulating layer 108, a second electrode metal layer 106, a dielectric layer 105, and a semiconductor structure (L) that includes a second-type semiconductor layer 104, an active layer 103, and a first-type semiconductor layer 102 that are sequentially stacked. The embodiment also includes a side-wall insulating layer 107, an electrical connecting structure 109 that has a first electrical connecting structure 109a, and a second electrical connecting structure 109b, a first electrode 120, and a second electrode 130.

A detailed account of each layer in the stacked structure of the light-emitting device 10 will be given below.

The substrate 100 is a conductive substrate. The conductive substrate may be a silicon, silicon carbide, or metal substrate. In cases where a metal substrate is used, the metal is preferably copper, tungsten or molybdenum. The substrate 100 has a thickness that may range from 50 μm to 300 μm.

The semiconductor layer (L) has a first surface (S1), a second surface (S2) that is opposite to the first surface (S1). The semiconductor layer (L) includes a first-type semiconductor layer 102, a second-type semiconductor layer 104, and an active layer 103 that is located between the first-type semiconductor layer 102 and the second-type semiconductor layer 104. The first surface (S1) of the semiconductor structure (L) is located on the first-type semiconductor layer 102, and the second surface (S2) of the semiconductor structure (L) is located on the second-type semiconductor layer 104. The first-type semiconductor layer 102 and the second-type semiconductor layer 104 may be doped to be either an n-type semiconductor layer that provides electrons or a p-type semiconductor layer that provides holes. The n-type semiconductor layer may be doped with elements such as silicon (Si), germanium (Ge) or tin (Sn), and the p-type semiconductor layer may be doped with elements such as magnesium (Mg), zinc (Zn), calcium (Ca), strontium (Sr) or barium (Ba). In other embodiments, the conductivity type of the first-type semiconductor layer 102 and the second-type semiconductor layer 104 may be interchanged. The first-type semiconductor layer 102 may be either one of the p-type or the n-type, while the second-type semiconductor layer 104 will be the remaining type.

The first-type semiconductor layer 102, the active layer 103, and the second-type semiconductor layer 104 may be made of indium gallium aluminum nitride (InGaAlN), gallium nitride (GaN), aluminum gallium nitride (AlGaN), aluminum indium phosphide (AlInP), aluminum gallium indium phosphide (AlGaInP), gallium arsenide (GaAs), or aluminum gallium arsenide (AlGaAs). The first-type semiconductor layer 102 and/or the second-type semiconductor layer 104 may include a cover layer that provides either electrons or holes, and may additionally include one or more other layers. For example, the others layers may include a current spreading layer, a window layer, and/or an ohmic contact layer, and may be designed according to different doping concentrations or chemical compositions in the light-emitting device 10. The active layer 103 is an area for recombination of electron and holes to emit light. The active layer 103 may be made from different materials to emit light at different wavelengths, and may be a single quantum well structure or a periodic multiple quantum well structure. By adjusting the composition ratio of the active layer 103, specific wavelengths of light may be emitted. Preferably, in some embodiments, the active layer 103 is made of aluminum gallium indium phosphide (AlGaInP) or aluminum gallium arsenide (AlGaAs); in this case, the active layer 103 emits red light or infra-red light.

The light-emitting device 10 further includes at least one through hole (H). It should be noted however, that the number of through holes (H) are not limited and the light-emitting device 10 may have any number of through holes (H). The through hole (H) passes through the first-type semiconductor layer 102, the second-type semiconductor layer 104, and the active layer 103 of the semiconductor structure (L); therefore, the through hole (H) passes through the entire semiconductor structure (L) (see FIG. 1). In cases where there are multiple through holes (H), the through holes (H) may be uniformly distributed or non-uniformly distributed throughout the semiconductor structure (L). FIG. 2 is a top view showing the first embodiment of the light-emitting device 10. By virtue of the through holes (H) and the electrical connecting structures 109, current flowing through the semiconductor structure (L) may be evenly spread out and distributed, thereby improving the light emission uniformity and luminous efficacy of the light-emitting device 10.

The through hole (H) has a first section (H1), and the first-type semiconductor layer 102 is exposed through the first section (H1) of the through hole (H) to be electrically connected with the electrical connecting structure 109 within the through hole (H). A first angle ($\theta 1$) between a side wall of the first type semiconductor layer 102 that bounds the first section (H1) of the through hole (H) and the plane of the first surface (S1) ranges from 0° to 90°. In some embodiments, the first angle ($\theta 1$) is preferably no less than 45° and no greater than 90° and the first section (H1) tapers inwardly from the first surface (S1). In some embodiments, the first section (H1) of the through hole (H) exposes a portion of the first-type semiconductor layer 102. In some embodiments, the first section (H1) of the through hole (H) exposes the whole of the first-type semiconductor layer 102.

The through hole (H) further has a second section (H2) that exposes the second-type semiconductor layer 104 and the active layer 103. A second angle ($\theta 2$) between a side wall of the second-type semiconductor layer 104 that bounds the second hole section (H2) of the through hole (H) and the plane of the second surface (S2) ranges from 30° to 90°. In some embodiment, the second angle ($\theta 2$) preferably ranges from 30° to 45°.

In this embodiment, the second section (H2) tapers inwardly from the second surface (S2). The tapering of the second section (H2) allows light that is emitted from the active layer 103 to be reflected upwards and toward the light exit side of the semiconductor structure (L). This helps to reduce the number of internal reflections of light emitted from the active layer 103, and decreases the amount of photons absorbed by the semiconductor structure (L) when the light travels therethrough, thereby increasing light emission efficacy and brightness of the light-emitting device 10.

The through holes (H) of the light-emitting device 10 according to the disclosure is a multi-section design having the first section (H1) and the second section (H2), which makes the formation of the through hole (H) comparatively easier. In comparison with a single sectioned through hole whose boundary is bent, the two-section design according to the disclosure allows the through hole (H) to be made smaller, which reduces the area of the semiconductor structure (L) (areas of the active layer 103 and the first and second type semiconductor layers) that has to be removed and sacrificed for forming the through hole (H), and thereby reduces the amount of light emitting area loss and light loss.

The electrical connecting structure 109 is disposed in the through hole (H), the electrical connecting structure 109 extends from the through hole (H) to the first surface (S1) of the semiconductor structure (L) to be electrically connected to the first-type semiconductor layer 102. The electrical connecting structure 109 is electrically insulated from the second-type semiconductor layer 104 and the active layer 103. More specifically, the side-wall insulating layer 107 is disposed between the electrical connecting structure 109 and the active layer 103, and between the electrical connecting structure 109 and the second-type semiconductor layer 104, and insulates the electrical connecting structure 109 from the semiconductor layer 104 and the active layer 103.

The electrical connecting structure 109 has a first electrical connecting structure 109a and a second electrical connecting structure 109b. The first electrical connecting structure 109a fills the first section (H1) of the through hole (H), and extends to the first surface (S1) of the first-type semiconductor layer 102. The first electrical connecting structure 109a is made of a material selected from at least one of the group consisting of gold germanium alloy (AuGe), gold (Au), gold germanium nickel alloy (AuGeNi), nickel (Ni), platinum (Pt), titanium (Ti), and silver (Ag).

The light-emitting device 10 further includes an ohmic contact layer 111 disposed on top of the first-type semiconductor layer 102. More specifically, the first electrical connecting structure 109a of the electrical connecting structure 109 is electrically connected to the first-type semiconductor layer 102 via the ohmic contact layer 111, thereby forming an ohmic contact between the first electrical connecting structure 109a and the first-type semiconductor layer 102. The ohmic contact layer 111 is located between the first electrical connecting structure 109a and the first-type semiconductor layer 102 and only occupies a portion of the first surface (S1) of the first-type semiconductor layer 102. The ohmic contact layer 111 has a thickness that is no greater than 600 nm. In some embodiments, the ohmic contact layer 111 has a thickness that is preferably greater than 20 nm and no greater than 300 nm. In this embodiment, the ohmic contact layer 111 is made of a material that includes gallium arsenide (GaAs), and a doping concentration in the gallium arsenide (GaAs) of the ohmic contact layer 111 ranges from $3E18/cm^3$ to $5E18/cm^3$. In this embodiment, the dopant used for the gallium arsenide (GaAs) is silicon. However, in other embodiments the dopant may be an N-type dopant such as silicon (Si), germanium (Ge), tin (Sn), and tellurium (Te). In some embodiments, the ohmic contact layer 111 includes highly doped (high doping concentration) gallium arsenide (GaAs), is only disposed on a portion of the first surface (S1) of the first-type semiconductor layer 102, and is located between the first electrical connecting structure 109a and the first-type semiconductor layer 102. In this case, the ohmic contact layer 111 including highly doped gallium arsenide (GaAs) has a thickness that is no greater than 600 nm. However, in other embodiments, the ohmic contact layer 111 including the highly doped gallium arsenide (GaAs) has a thickness that is less than 300 nm. An electrical contact resistance between the first-type semiconductor layer 102 and the electrical connecting structure 109 is greater than that between the ohmic contact layer 111 with the highly doped gallium arsenide (GaAs) and the electrical connecting structure 109. In some embodiments, a surface area of the first surface (S1) of the first-type semiconductor layer 102 that is not covered by the first electrical connecting structure 109a is made of aluminum gallium indium phosphide (AlGaInP) or aluminum gallium arsenide (AlGaAs).

The second electrical connecting structure 109b fills the second section (H2) of the through hole (H) and is electrically connected to the first electrode metal layer 110. The second electrical connecting structure 109b is made from a material selected from the group consisting of gold (Au), platinum (Pt), silver (Ag), tin (Sn), nickel (Ni), gold tin alloy (AuSn), nickel tin alloy (NiSn), and silver tin alloy (AgSn).

The side-wall insulating layer 107 is disposed between the second electrical connecting structure 109b and the second-type semiconductor layer 104, and between the second electrical connecting structure 109b and the active layer 103, and is used to segregate the second electrical connecting structure 109b from the second-type semiconductor layer 104 so that they are electrically insulated. Additionally, the side-wall insulating layer 107 is used to segregate the second electrical connecting 109b and the active layer 103 so that they are electrically insulated. The side-wall insulating layer 107 may be made of a material selected from the group consisting of fluorides, nitrides and oxides. More specifically, the side-wall insulating layer 107 may be made from a material that is selected from the group consisting of zinc oxide (ZnO), silicon dioxide ($SiO_2$), silicon oxide ($SiO_x$), silicon oxynitride ($SiO_xN_y$), silicon nitride ($Si_3N_4$), aluminum oxide ($Al_2O_3$), titanium oxide ($TiO_x$), magnesium fluoride (MGF), and gallium fluoride (GaF). In some embodiments, the side-wall insulating layer 107 is formed via a deposition method, and, because the through hole (H) is tapered and the boundary wall of the through hole (H) has a predetermined inclined angle, the deposition of the side-wall insulating layer 107 may be more uniform and complete, thereby providing uniform coverage over the side walls of the active layer 103 and of the second-type semiconductor layer 104, and ensuring a good electrical insulation between the electrical connecting structure 109 and the active layer 103, and between the electrical connecting structure 109 and the second-type semiconductor layer 104.

The first electrode metal layer 110 is disposed on and electrically insulated from the second surface (S2) of the semiconductor structure (L), and is electrically connected to the second electrical connecting structure 109b. The first electrode metal layer 110 bonds the semiconductor structure (L) to the substrate 100. The first electrode metal layer 110 may be made from a material selected from the group consisting of gold (Au), platinum (Pt), titanium (Ti), silver (Ag), tin (Sn), nickel (Ni), gold tin alloy (AuSn), nickel tin alloy (NiSn), and silver tin alloy (AgSn).

The second electrode metal layer 106 is located between the second-type semiconductor layer 104 and the first electrode metal layer 110. More specifically, the second electrode metal layer 106 is located on the second surface-type semiconductor layer 104. The second electrode metal layer 106 includes at least one metal reflection layer (not shown in the figures). The metal reflection layer may reflect light propagating toward the substrate 100 back into the semiconductor structure (L) so that the light may be radiated upward and outward from a light-emitting side of semiconductor structure (L) (i.e., the first surface (S1) of the first type semiconductor layer). The metal reflection layer may be a single layer structure or a multilayer structure, and may include at least one metal, or be made from an alloy, from the following materials: silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and hafnium (Hf).

The second electrode metal layer 106 includes a solder pad formation area that is not covered by the semiconductor structure (L). The light-emitting device further includes a second electrode 130. The second electrode 130 is formed on top of the solder pad formation area, and is electrically connected to the second-type semiconductor layer 104. The second electrode 130 includes a solder pad for connection with external wiring during packaging. The solder pad of the second electrode 130 may be designed to be different shapes for wire bonding purposes. For example, the second electrode may be a cylinder, a square, or other polygonal shapes.

The dielectric layer 105 is located between the second-type semiconductor layer 104 and the second electrode metal layer 106. The dielectric layer 105 has a plurality of openings 105a that are either uniformly or non-uniformly distributed on the second surface (S2) of the second-type semiconductor layer 104. The light-emitting device 10 further includes a second ohmic contact layer (not shown in the figures). The second ohmic contact layer is filled in the openings 105a of the dielectric layer 105 so that a plurality of ohmic contact areas are formed. Therefore, the second ohmic contact layer does not contact the second-type semiconductor layer 104 as a whole surface, instead the plurality of discrete ohmic contact areas allow uniform current flow from the second electrode metal layer 106 to the semiconductor structure (L). The second ohmic contact layer may be a transparent conductive layer that is made of a material selected from the group consisting of indium tin oxide (ITO), indium zinc oxide (IZO), indium zinc tin oxide (IZTO), indium aluminum tin oxide (IAZO), indium gallium zinc oxide (IGZO), indium gallium tin oxide (IGTO), aluminum zinc oxide (AZO), and aluminum tin oxide (ATO). In some embodiments, the transparent conductive layer may be replaced with a metal conductive layer that is preferably made from an alloy such as a gold tin alloy, a gold germanium alloy, a gold germanium nickel alloy or a gold beryllium alloy. Additionally, it should be noted that the second ohmic contact layer may have a single layer structure or a multi layer structure.

The dielectric layer 105 may be made from an insulating material that has lower conductivity than either the metal reflection layer or the second ohmic contact layer, or be made from a material that may form a Schottky contact with the second-type semiconductor layer 104. For example, the dielectric layer 105 may be made from a material selected from the group consisting of fluorides, nitrides, and oxides. Specifically, the dielectric layer 105 may be made from a material selected from the group consisting of zinc oxide (ZnO), silicon dioxide ($SiO_2$), silicon oxide ($SiO_x$), silicon oxynitride ($SiO_xN_y$), silicon nitride ($Si_3N_4$), aluminum oxide ($Al_2O_3$), titanium oxide ($TiO_x$), magnesium fluoride (MGF), gallium fluoride (GaF). The dielectric layer 105 may include at least one dielectric layer or it may include a stack of dielectric layers 105 each having different refractive indices. More preferably, the dielectric layer 105 is a transparent dielectric layer, where at least 50% of the light rays can pass through the dielectric layer 105 without being absorbed or reflected. More preferably, the dielectric layer 105 has a refractive index that is lower than that of the semiconductor structure (L).

The metal reflective layer and the dielectric layer cooperatively form an omni-directional reflector (ODR) structure, which can reflect light propagating from the semiconductor structure (L) toward the substrate 100 back toward the semiconductor structure (L), and enable light to radiate out of the light-emitting device 10 from the light-emitting side, which increases light emission efficiency.

The light-emitting device 10 further includes a first electrode 120. The first electrode 120 forms an electrical connection with the first-type semiconductor layer 102 through the first electrode metal layer 110. In this embodiment, the first electrode 120 is disposed on a back side of the substrate 100 as a monolithic structure. The substrate 100 in this embodiment is a conductive supporting substrate, and the second electrode 130 and the first electrode 120 are formed on the two opposite surface of the substrate 100 so that an electrical current will flow vertically through the semiconductor structure (L), which provides uniform current density and enhanced light emission uniformity in the light-emitting device 10.

The second electrode 130 and the first electrode 120 are preferably made of a metallic material.

The second insulating layer 108 is located between the second electrode metal layer 106 and the first electrode metal layer 110 to segregate the second electrode metal layer 106 from the first electrode metal layer 110 and electrically insulate the second electrode metal layer 106 and the first electrode metal layer 110. The second insulating layer 108 may be made of a material selected from the group consisting of fluorides, nitrides, and oxides. Specifically, the second insulating layer 108 may be made from at least one material selected from the group consisting of zinc oxide (ZnO), silicon dioxide ($SiO_2$), silicon oxide ($SiO_x$), silicon oxynitride ($SiO_xN_y$), silicon nitride ($Si_3N_4$), aluminum oxide ($Al_2O_3$), titanium oxide ($TiO_x$), magnesium fluoride (MgF), and gallium fluoride (GaF).

In summary of the above, the light-emitting device 10 according to the present disclosure can improve current spreading uniformity, and improve the uniformity of brightness and the luminous efficacy of the light-emitting device 10. The through holes (H) are multi-sectioned which facilitates manufacturing processes of the through holes (H) and reduces the area of the semiconductor structure (L) that is sacrificed due to removal thereof for forming the through holes, thereby resulting in comparatively less light loss. Additionally, the inclined boundary of the through hole (H) may reflect light emitted from the active layer 103 in an upwards direction and allow the light to radiate outward from the light exist side at the top the semiconductor structure (L). This decreases the number of internal reflection of light in the semiconductor structure (L) and decreases the probability of absorption by the semiconductor structure (L), thereby increasing light extraction efficiency and brightness of the light-emitting device 10.

Figure 3:
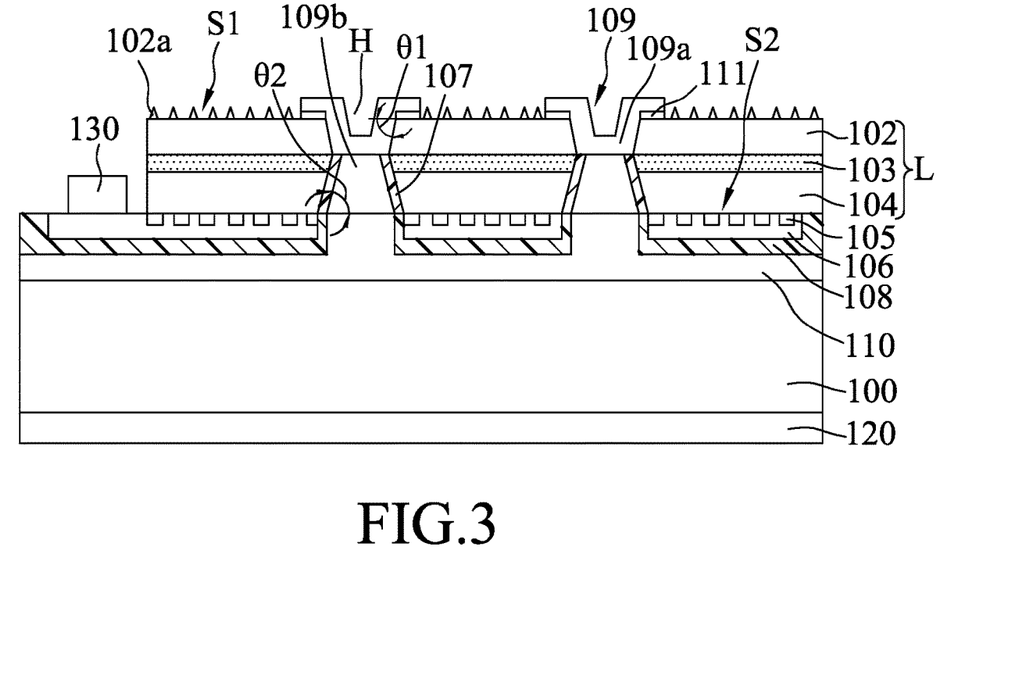
FIG. 3 is a schematic side view illustrating a second embodiment of the light-emitting device according to the present disclosure.

Referring to FIGS. 1 and 3, a second embodiment of the light-emitting device 10 is shown in FIG. 3. The second embodiment is similar to the first embodiment, except that while the first surface (S1) of the first-type semiconductor layer 102 in the first embodiment is smooth and flat, in the second embodiment, except for the areas of the first surface (S1) that are covered by the electrical connecting structure 109, the remaining areas of the first surface (S1) are covered by a roughened structure 102a. By roughening the remaining areas of the first surface (S1) the brightness of the light-emitting device 10 may be increased, and the luminous efficacy of the light-emitting device 10 may be enhanced.

Figure 4:
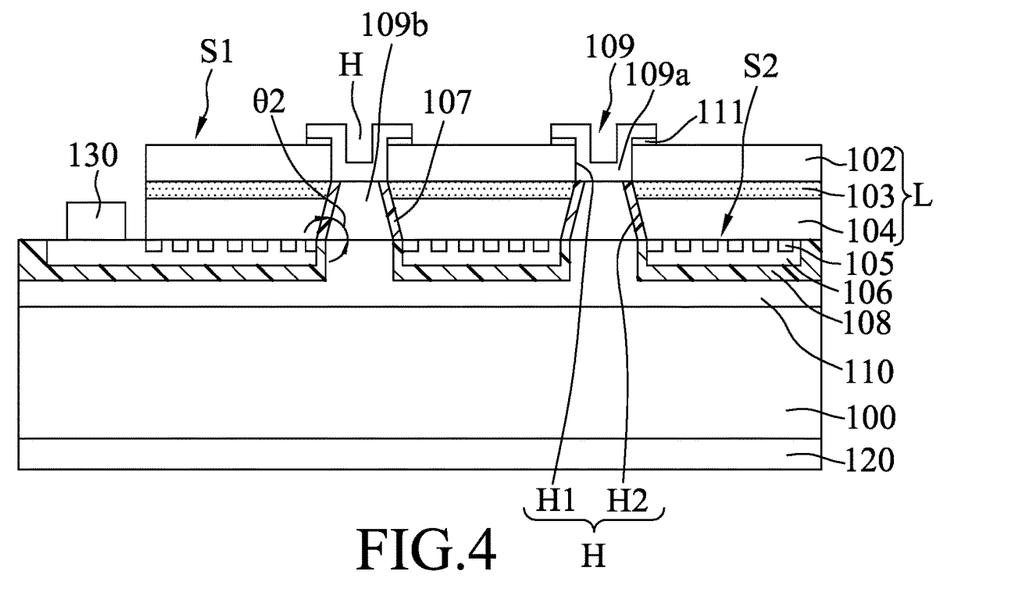
FIG. 4 is a schematic side view illustrating a third embodiment of the light-emitting device according to the present disclosure.

Referring to FIGS. 1 and 4, a third embodiment according to the present disclosure is shown in FIG. 4. The third embodiment is different from the first embodiment in that, while in the first embodiment the first section (H1) of the through hole (H) is tapered, in the third embodiment, the first section (H1) of the through hole (H) is vertically straight. The first section (H1) of the through hole (H) exposes the first-type semiconductor layer 102. The multi-sectioned through hole (H) design facilitates manufacturing process, and decreases the amount of area used to form the through hole (H) which reduces the amount of volume lost in the semiconductor structure (L), thereby decreasing the amount of brightness loss. At the same time, the through hole (H) design improves current spreading uniformity and enhances brightness uniformity and luminous efficacy.

Figure 5:
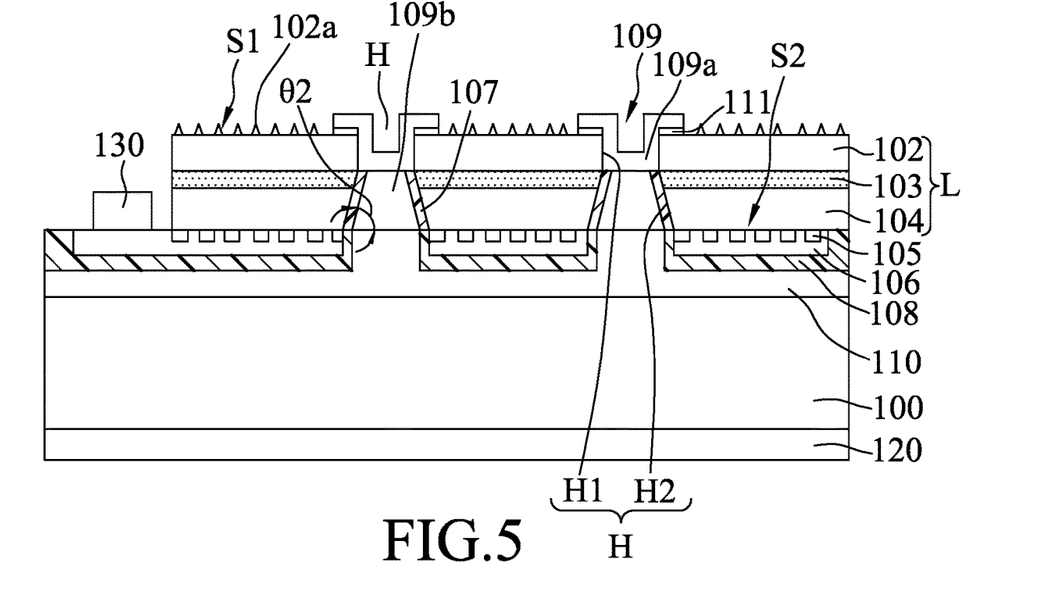
FIG. 5 is a schematic side view illustrating a fourth embodiment of the light-emitting device according to the present disclosure.

Referring to FIGS. 4 and 5, a fourth embodiment of the light-emitting device 10 according to the present disclosure is shown in FIG. 5. The fourth embodiment is similar to the third embodiment except in that the first surface (S1) of the first-type semiconductor layer 102, except for the area covered by the first electrical connecting structure 109a, has a roughened structure 102a. The roughened structure 102a may enhance light extraction efficiency, and improve the luminous efficacy of the light emitting device 10.

Figure 6:
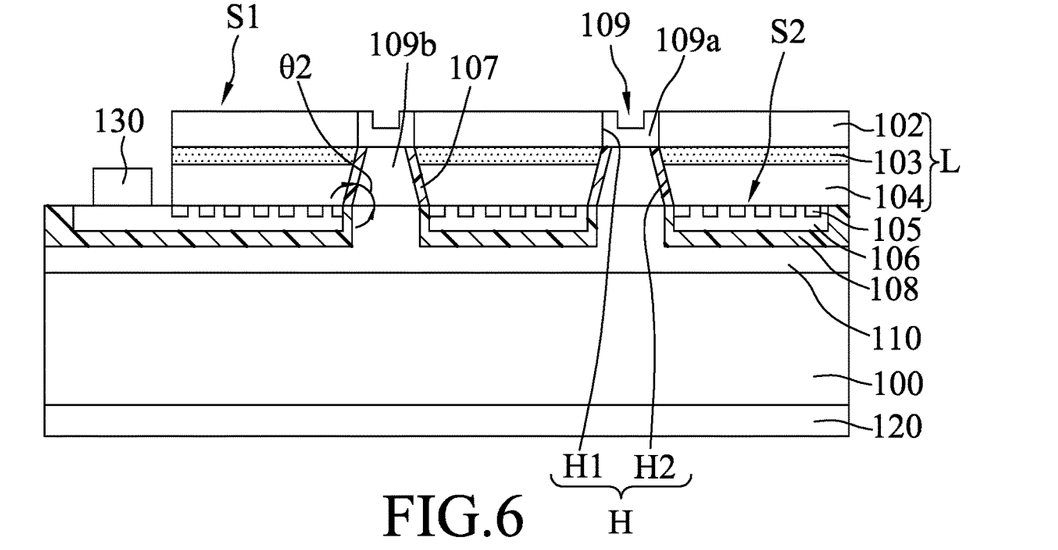
FIG. 6 is a schematic side view illustrating a fifth embodiment of the light-emitting device according to the present disclosure.

Referring to FIGS. 4 and 6, a fifth embodiment of the light-emitting device 10 according to the present disclosure is shown in FIG. 6. The fifth embodiment is similar to the third embodiment, except in that the first electric connecting structure 109a does not cover any part of the first surface (S1) of the first-type semiconductor layer 102. Instead, the first electric connecting structure 109a is filled only in the first section (H1), and is electrically connected to a part of the first-type semiconductor layer 102 exposed to an interior the through hole (H). In this embodiment, the semiconductor structure (L) of the light-emitting device is preferably made of a material that includes indium gallium aluminum nitride (InGaAlN), and the electric connecting structure 109 is electrically connected to the first-type semiconductor layer 102 that is exposed to an interior of the first section (H1) of the through hole (H).

Figure 7:
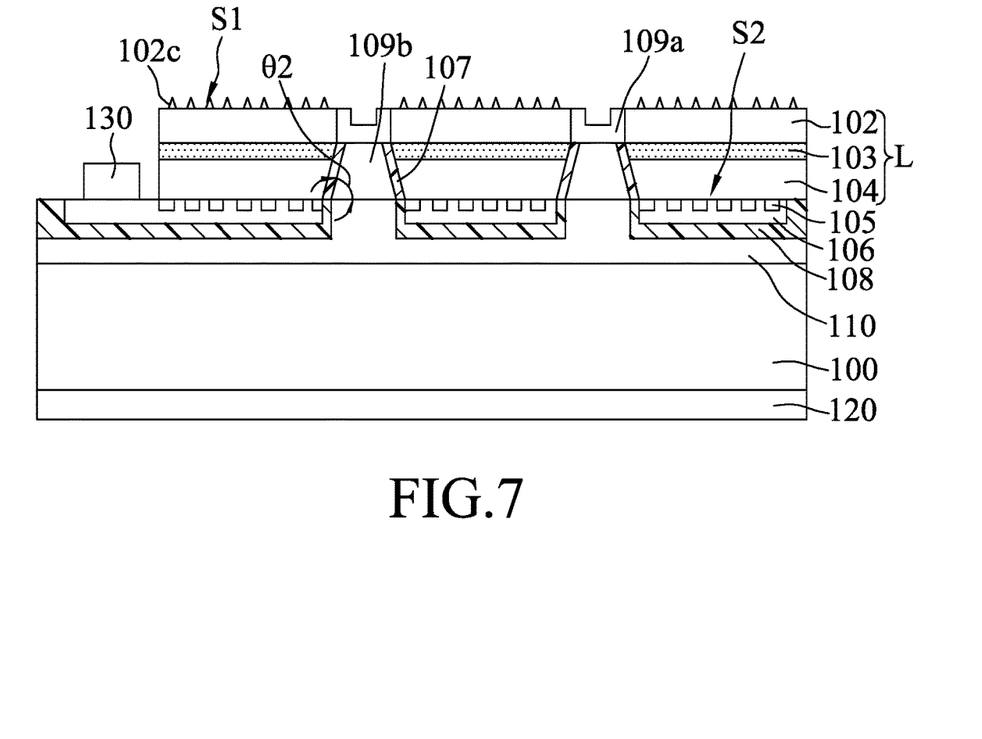
FIG. 7 is a schematic side view illustrating a sixth embodiment of the light-emitting device according to the present disclosure.

Referring to FIGS. 6 and 7, a sixth embodiment of the light-emitting device 10 according to the present disclosure is shown in FIG. 7. The sixth embodiment is similar to the fifth embodiment, except that the fifth embodiment has a roughened structure 102c on the first surface (S1) of the first-type semiconductor layer 102 in the areas not covered by the first electrical connecting structure 109a. The roughened structure 102c may improve the light extraction efficiency of the light-emitting device, and thereby improve the luminous efficacy of the light-emitting device 10.

Figure 8:
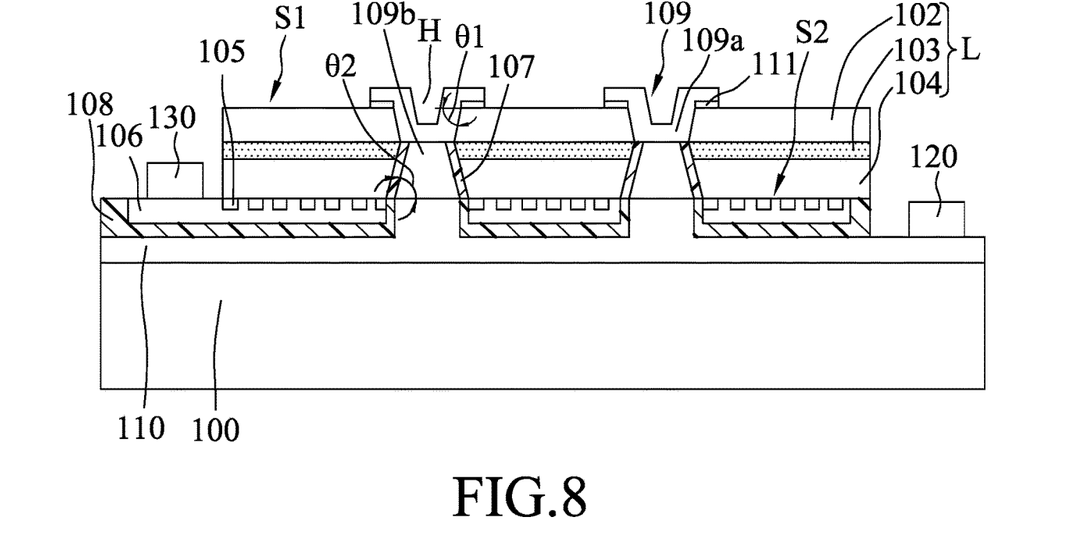
FIG. 8 is a schematic side view illustrating a seventh embodiment of the light-emitting device according to the present disclosure.

FIG. 8 shows a seventh embodiment of the light-emitting device 10 according to the present disclosure. The seventh embodiment is similar to the first embodiment, except that in the seventh embodiment the first electrode 120 is located on top of the first electrode metal layer 110. In this embodiment, the substrate 100 is preferably made of aluminum nitride (AlN), aluminum oxide ($Al_2O_3$), silicon carbide (SiC), silicon (S), molybdenum (Mo) or a polymer. The though holes (H) of the light-emitting device 10 improves current spreading uniformity, and increases the brightness and the uniformity of brightness as well as the luminous efficacy of the light-emitting device 10.

Figure 9:
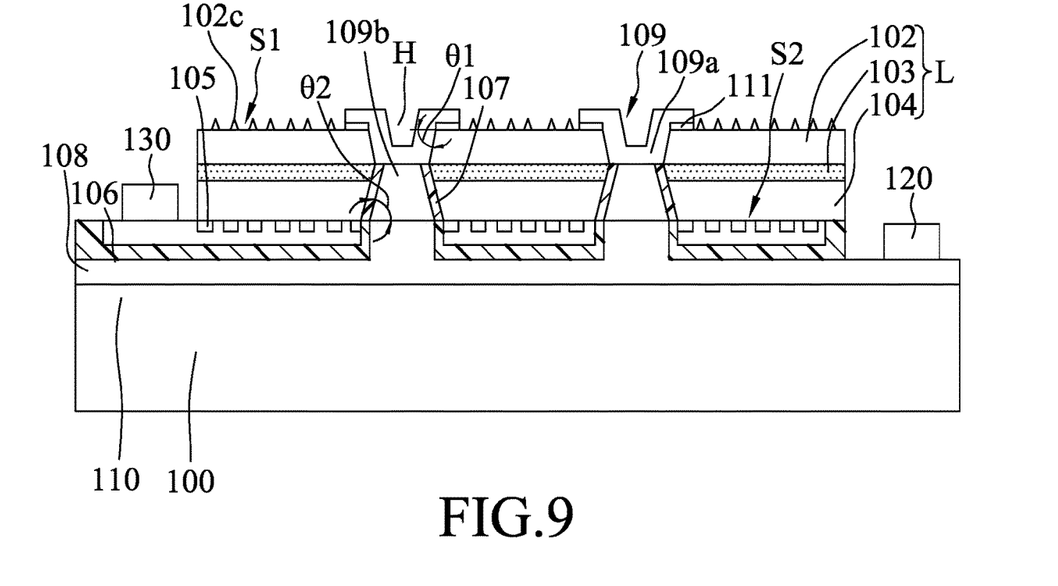
FIG. 9 is a schematic side view illustrating an eighth embodiment of the light-emitting device according to the present disclosure.

FIG. 9 shows an eighth embodiment of the light-emitting device 10 according to the present disclosure. The eighth embodiment is similar to the seventh embodiment except in that, the eighth embodiment has a roughened structure 102c on the areas of the first surface (S1) of the first-type semiconductor layer 102 that are not covered by the first electrical connecting structure 109a. The roughened structure 102c may improve light extraction efficiency, and thereby improve the luminous efficacy of the light-emitting device 10.

Figure 10:
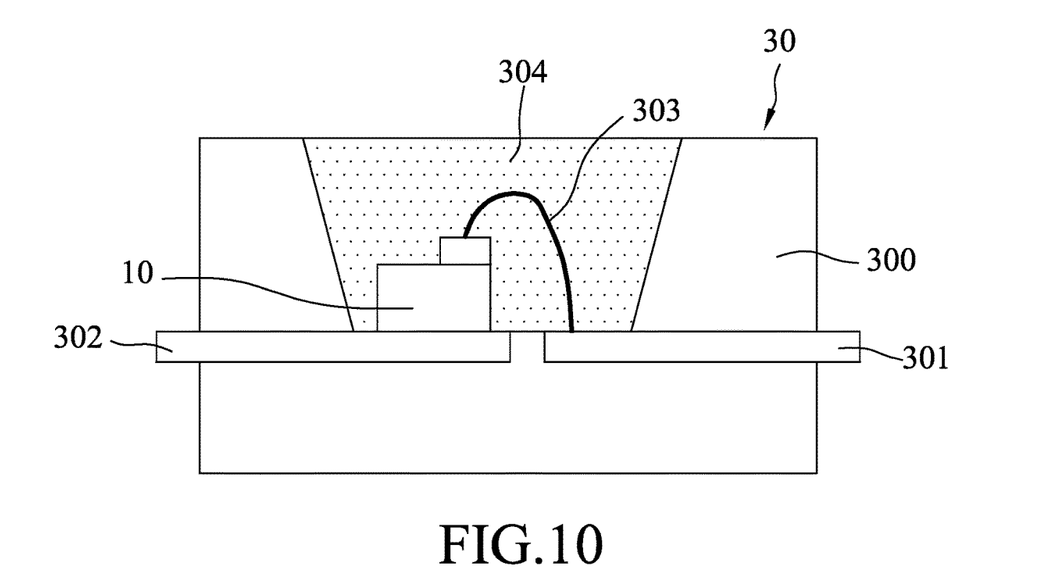
FIG. 10 is a schematic side view illustrating an embodiment of the lighting apparatus according to the present disclosure.

FIG. 10 shows an embodiment of the lighting apparatus according to the present disclosure. The lighting apparatus may be used in high-powered lighting equipment such as projectors, stage lights, torch lights, and endoscopes.

More specifically, the lighting apparatus includes a packaging body that includes an installation board 30, a sealing resin 304, and the light-emitting device 10 of the present disclosure. The lighting apparatus includes at least one light-emitting device 10 that is installed on the installation board 30. The installation board 30 may be a printed circuit board (PCB) such as a metal core printed circuit board (MCPCB), a metal printed circuit board (MPCB) or a flexible printed circuit board (FPCB). The installation board 30 has a first electrode 301 and second electrode 302 that is spaced apart from the first electrode 301. The light-emitting device 10 is disposed above a top surface of the installation board 30, and is electrically connected to the first electrode 301 via a connecting cable 303. The sealing resin 304 may include photoluminescent materials such as phosphor or quantum dots. The sealing resin 304 may have a spherical lens shape and may have a convex lens structure (not shown in the figures). A variety of different components and structures may be incorporated to the lighting apparatus to adjust the angle of the light emitted by the lighting apparatus.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device comprising:
   a semiconductor structure having a first surface and a second surface that is opposite to said first surface, and includes a first-type semiconductor layer, a second-type semiconductor layer, and an active layer that is located between said first-type semiconductor layer and said second-type semiconductor layer, said first surface of said semiconductor structure being located on said first-type semiconductor layer, and said second surface of said semiconductor structure being located on said second-type semiconductor layer;
   a through hole passing through said first-type semiconductor layer, said second-type semiconductor layer, and said active layer of said semiconductor structure;
   an electrical connecting structure disposed in said through hole, said electrical connecting structure extending from said through hole to said first surface of said semiconductor structure to be electrically connected to said first-type semiconductor layer; and
   a first electrode metal layer disposed on and electrically insulated from said second surface of said semiconductor structure, and being electrically connected to said electrical connecting structure;
   wherein said through hole has a first section, and said first-type semiconductor layer being exposed through said first section of said through hole to be electrically connected with said electrical connecting structure within said through hole;
   wherein a first angle between a side wall of said first-type semiconductor layer that bounds said first section of said through hole and the plane of said first surface ranges from 0° to 90°.

2. The light-emitting device as claimed in claim 1, wherein said first section of said through hole tapers inwardly from said first surface of said semiconductor structure.

3. The light-emitting device as claimed in claim 1, wherein said first section of said through hole exposes a portion or whole of said first-type semiconductor layer.

4. The light-emitting device as claimed in claim 1, wherein:
   said through hole further has a second section that exposes said second-type semiconductor layer and said active layer; and
   a second angle between a side wall of said second-type semiconductor layer that bounds said second section of said through hole and the plane of said second surface ranges from 30° to 90°.

5. The light-emitting device as claimed in claim 4, wherein said second section of said through hole tapers inwardly from said second surface of said semiconductor structure.

6. The light-emitting device as claimed in claim 1, wherein said active layer is made of a material that is made of aluminum gallium indium phosphide (AlGaInP) or aluminum gallium arsenide (GaAlAs).

7. The light-emitting device as claimed in claim 1, wherein said electrical connecting structure is not electrically connected with said second-type semiconductor layer and said active layer; and
   said light-emitting device further comprising a side-wall insulating layer disposed between said electrical connecting structure and said active layer, and between said electrical connecting structure and said second-type semiconductor layer.

8. The light-emitting device as claimed in claim 1, further comprising an ohmic contact layer disposed on top of said first-type semiconductor layer, said electrical connecting structure being electrically connected to said first-type semiconductor layer via said ohmic contact layer.

9. The light-emitting device as claimed in claim 8, wherein said ohmic contact layer is located between said electrical connecting structure and said first-type semiconductor layer, and cover a portion of said first surface of said first-type semiconductor layer surrounding said through hole.

10. The light-emitting device as claimed in claim 8, wherein:
    said ohmic contact layer includes a material that includes gallium arsenide (GaAs); and
    a doping concentration in the gallium arsenide (GaAs) of said ohmic contact layer ranges from $3E \times 10^{18}/cm^3$ to $5E \times 10^{18}/cm^3$.

11. The light-emitting device as claimed in claim 9, wherein an electrical contact resistance between said first-type semiconductor layer and said electrical connecting structure is greater than that between said ohmic contact layer and said electrical connecting structure.

12. The light-emitting device as claimed in claim 1, wherein a surface area of said first surface of said first-type semiconductor layer that is not covered by said electrical connecting structure is made of aluminum gallium indium phosphide (AlGaInP) or aluminum gallium arsenide (AlGaAs).

13. The light-emitting device as claimed in claim 1, wherein:
    said electrical connecting structure has a first electrical connecting structure and a second electrical connecting structure;
    said first electrical connecting structure fills said first section of said through hole, and extends to said first surface of said first-type semiconductor layer.

14. The light-emitting device as claimed in claim 13, wherein:
    said through hole further has a second section that exposes said second-type semiconductor layer and said active layer; and
    said second electrical connecting structure fills said second section of said through hole, and electrically connects with said first electrode metal layer.

15. The light-emitting device as claimed in claim 1, further comprising a second electrode metal layer that is located between said second-type semiconductor layer and said first electrode metal layer, and that is electrically connected with said second-type semiconductor layer.

16. A light-emitting device comprising:
    a semiconductor structure having a first surface, and a second surface opposite to said first surface, and including a first-type semiconductor layer, a second-type semiconductor layer, and an active layer that is located between said first-type semiconductor layer and said second-type semiconductor layer, said first surface of said semiconductor structure being located on said first-type semiconductor layer, and said second surface being located on said second-type semiconductor layer;
    a through hole that passes through said first surface, said second surface, and said active layer of said semiconductor structure;
    an electrical connecting structure disposed in said through hole, and contacting said first-type semiconductor layer;

a first electrode metal layer disposed on and electrically insulated from said second surface of said semiconductor structure, and being electrically connected to said electrical connecting structure;

wherein said through hole has a first section, and said first-type semiconductor layer being exposed through said first section of said through hole to be electrically connected with said electrical connecting structure within said through hole; and wherein a first angle between a side wall of said first-type semiconductor layer that bounds said first section of said through hole and the plane of said first surface ranges from 0° to 90°.

17. The light-emitting device as claim in claim 16, wherein:

said through hole further has a second section that exposes said second-type semiconductor layer and said active layer; and a second angle between a side wall of said second-type semiconductor layer that bounds said second section of said through hole and the plane of said second surface ranges from 30° to 90°.

18. The light-emitting device as claimed in claim 16, wherein:

said electrical connecting structure is not electrically connected to said second-type semiconductor layer and said active layer; and said light-emitting device further comprising a side-wall insulating layer that is disposed between said electrical connecting structure and said second-type semiconductor layer, and between said electrical connecting structure and said active layer.

19. The light emitting device as claimed in claim 16, wherein:

said electrical connecting structure has a first electrical connecting structure, and a second electrical connecting structure; and said first electrical connecting structure fills said first section of said through hole, said through hole further having a second section, said second electrical connecting structure filling said second section of said through hole and being electrically connected to said first electrode metal layer.

20. A lighting apparatus that uses the light-emitting device as claimed in claim 1.

* * * * *